(12) United States Patent
Dunn et al.

(10) Patent No.: US 7,423,608 B2
(45) Date of Patent: Sep. 9, 2008

(54) HIGH IMPEDANCE ELECTROMAGNETIC SURFACE AND METHOD

(75) Inventors: Gregory J. Dunn, Arlington Heights, IL (US); Robert T. Croswell, Hanover Park, IL (US); George H. Kumpf, Hanover Park, IL (US); John A. Svigelj, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 295 days.

(21) Appl. No.: 11/312,286

(22) Filed: Dec. 20, 2005

(65) Prior Publication Data

US 2007/0139294 A1 Jun. 21, 2007

(51) Int. Cl.
*H01Q 15/24* (2006.01)

(52) U.S. Cl. ............................. 343/909; 343/700 MS; 343/756; 343/787

(58) Field of Classification Search ................ 343/909, 343/754, 853, 756, 778, 910
See application file for complete search history.

(56) References Cited

U.S. PATENT DOCUMENTS

| | | | |
|---|---|---|---|
| 6,021,050 A * | 2/2000 | Ehman et al. ............... 361/793 |
| 6,153,290 A * | 11/2000 | Sunahara .................... 428/210 |
| 6,366,254 B1 | 4/2002 | Sievenpiper et al. |
| 6,384,797 B1 | 5/2002 | Schaffner et al. |
| 6,483,480 B1 * | 11/2002 | Sievenpiper et al. ........ 343/909 |
| 6,483,481 B1 | 11/2002 | Sievenpiper et al. |
| 6,496,155 B1 | 12/2002 | Sievenpiper et al. |
| 6,518,931 B1 | 2/2003 | Sievenpiper |
| 6,538,621 B1 | 3/2003 | Sievenpiper et al. |
| 6,545,647 B1 | 4/2003 | Sievenpiper et al. |
| 6,552,696 B1 | 4/2003 | Sievenpiper et al. |
| 6,670,921 B2 | 12/2003 | Sievenpiper et al. |
| 6,739,028 B2 | 5/2004 | Sievenpiper et al. |
| 6,774,867 B2 * | 8/2004 | Diaz et al. .................. 343/909 |
| 6,885,561 B1 * | 4/2005 | Hashemi et al. ............. 361/760 |
| 6,891,190 B2 * | 5/2005 | Lian et al. ...................... 257/40 |
| 6,990,729 B2 * | 1/2006 | Pleskach et al. ................ 29/606 |
| 7,126,443 B2 * | 10/2006 | De Bhailis et al. .......... 333/185 |
| 7,136,274 B2 * | 11/2006 | Hwang et al. ............. 361/306.3 |
| 2003/0117328 A1 | 6/2003 | Sievenpiper et al. |
| 2004/0075617 A1 | 4/2004 | Lynch et al. |

* cited by examiner

*Primary Examiner*—Douglas W. Owens
*Assistant Examiner*—Chuc Tran

(57) ABSTRACT

A high impedance surface (300) has a printed circuit board (302) with a first surface (314) and a second surface (316), and a continuous electrically conductive plate (319) disposed on the second surface (316) of the printed circuit board (302). A plurality of electrically conductive plates (318) is disposed on the first surface (314) of the printed circuit board (302), while a plurality of elements are also provided. Each element comprises at least one of (1) at least one multi-layer inductor (330, 331) electrically coupled between at least two of the electrically conductive plates (318) and embedded within the printed circuit board (302), and (2) at least one capacitor (320) electrically coupled between at least two of the electrically conductive plates (318). The capacitor (320) comprises at least one of (a) a dielectric material (328) disposed between adjacent electrically conductive plates, wherein the dielectric material (328) has a relative dielectric constant greater than 6, and (b) a mezzanine capacitor embedded within the printed circuit board (302).

7 Claims, 8 Drawing Sheets

HIGH IMPEDANCE ELECTROMAGNETIC SURFACE AND METHOD

FIELD OF THE INVENTION

This invention relates generally to high impedance electromagnetic surfaces for antennas.

BACKGROUND OF THE INVENTION

Known radio frequency and microwave antennas used in handheld, laptop computer, and vehicular communication systems, for example, have a ground plane either by necessity, such as the ground plane of the printed circuit board in a cellular telephone or the metal surface of the vehicle, or intentionally to direct most of the radiation to a particular hemisphere of the antenna. The ground plane, however, can degrade the performance of the antenna unless the antenna is placed a quarter wavelength away from the ground plane, which results in constructive interference between the radiated and reflected fields. In addition, propagating surface waves lead to the undesirable characteristics of power loss, variations in radiation patterns due to ground plane edge effects, and, when antennas share a common ground plane, coupling that can result in unwanted radiation pattern nulls.

In order to eliminate or reduce these problems, a known high impedance surface is used to replace the ground plane, and is placed near the antenna. Unlike a typical highly conductive ground plane, the high impedance surface has a boundary condition that supports a tangential electric field. The antenna can then be placed closer to the high impedance surface since image currents are not phase reversed, which is a consequence of enforcing the boundary condition on the tangential electric field. The high impedance surface also reduces power consumption by improving the impedance match, reduces interference or coupling with other antennas on the platform, and can increase the usable frequency range of an antenna.

There are problems, however, associated with such prior art high impedance surfaces. Known high impedance surfaces, for example, often support only a limited resonant frequency range and typically are not compatible with frequencies less than ten GHz. This, of course, presents problems for platforms that rely upon lower frequency bands, such as many commercial and military wireless applications in the commercial cellular (about 800-2500 MHz), ultra high frequency (UHF) (about 300-1000 MHz), and very high frequency (VHF) (less than 300 MHz) bands. Many existing high impedance surfaces are also relatively thick, which is undesirable for many applications for which thickness and weight must be minimized.

BRIEF DESCRIPTION OF THE DRAWINGS

These needs and others are substantially met through provision of the high impedance surface as disclosed below. These and other benefits will become more clear upon making a thorough review and study of the following detailed description, particularly when reviewed in conjunction with the drawings, wherein.

DETAILED DESCRIPTION

Generally, the invention is directed to a high impedance surface with embedded elements such as capacitors and inductors. Here, a high impedance surface refers to any structure that reduces surface wave propagation.

The high impedance surface is configured, in one aspect of the invention, to comprise a printed circuit board with a first surface and a second surface. A continuous electrically conductive plate is disposed on the second surface of the printed circuit board to be used as a ground plane. A plurality of electrically conductive plates is disposed on the first surface of the printed circuit board and is electrically coupled to the ground plane by conductive vias extending through the printed circuit board.

The high impedance surface also has a plurality of elements where each element is at least one of (1) at least one multi-layer inductor electrically coupled between at least two of the electrically conductive plates and embedded within the printed circuit board, or (2) at least one capacitor electrically coupled between at least two of the electrically conductive plates. The capacitor comprises at least one of (a) a dielectric material disposed between adjacent electrically conductive plates where the dielectric material has a relative dielectric constant greater than 6, or (b) a mezzanine capacitor embedded within the printed circuit board.

When configured with both multi-layer inductors and mezzanine capacitors with the dielectric described here, the high impedance surface has a resonant frequency below 10 GHz and even below 1 GHz. These elements are provided in new configurations that provide an increase in capacitance but an even greater increase in inductance so that the high impedance surface provides an increased bandwidth in addition to a lower resonant frequency. The embedded structures are also shaped so that the total height of the high impedance surface remains extremely small, such as 0.25-0.5 mm total height.

Figure 1:
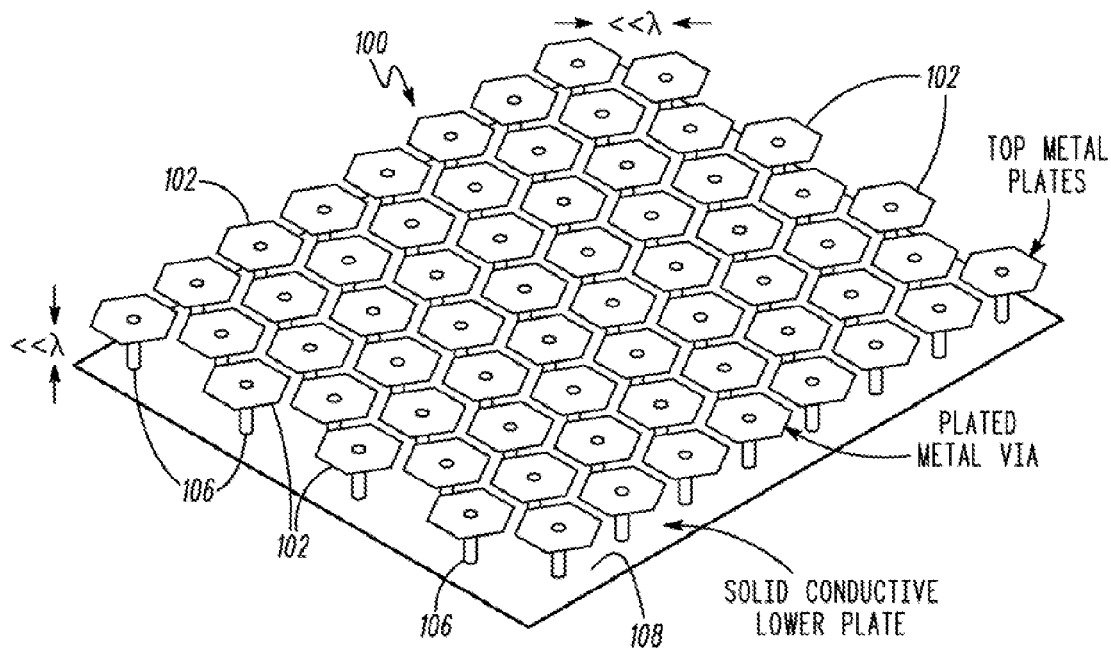
FIG. 1 is a top perspective view of a high impedance surface as known in the prior art.

Prior to a presentation of these teachings in greater detail, it may be helpful to first recount certain characterizing aspects of high impedance surfaces (any interested parties would find more information in U.S. Pat. Nos. 6,552,696; 6,483,480; 6,384,797; 6,366,254 and 6,262,495 issued to Daniel Sievenpiper et al.). As shown in FIG. 1, a conventional high impedance surface 100 has an array of conductive plates 102 on a printed circuit board 104 (shown in FIG. 2) where each plate 102 has a post 106 in the form of a conductive via that extends through the circuit board and that connects to the ground plane 108

Figure 2:
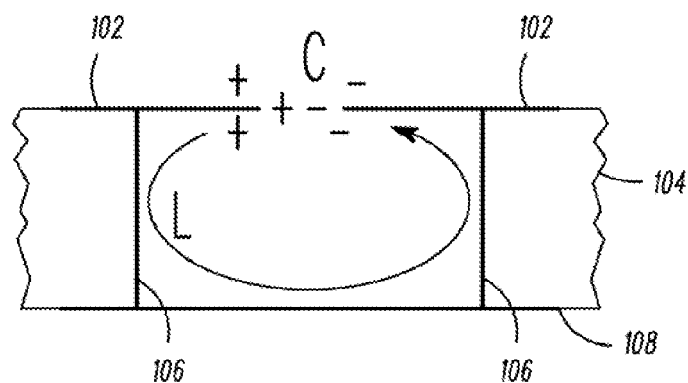
FIG. 2 is a schematic diagram of the capacitance and inductance of the prior art high impedance surface of FIG. 1.

As shown in FIG. 2, the high impedance surface forms a parallel resonant inductive/capacitive (LC) circuit with each pair of plates 102 and vias 106 cooperating with the ground plane. As the structure interacts with electromagnetic waves, currents are induced in the conductive plates 102. A high-frequency voltage applied parallel to the conductive plates 102 causes charges to build up on the ends of the plates, or in other words, a capacitance. While charges move back and forth on the high impedance surface, they flow around a long path down one via 106 from one conductive plate 102, through the ground plane 108, and back up another via 106 to another conductive plate 102. A magnetic field is associated with these currents, and therefore an inductance is present. These known high impedance surfaces, as noted above, tend to provide a limited resonant frequency range and typically cannot serve frequencies less than ten GHz.

Since a capacitance and inductance are present, it has been determined that increasing the two (C and L) will lower the resonant frequency. Increasing inductance alone, or increasing inductance considerably more than capacitance, will increase the bandwidth according to the known frequency and bandwidth equations $$f = \frac{1}{2\pi\sqrt{LC}} \quad (a)$$

$$\frac{\Delta f}{f} = \frac{\sqrt{L/C}}{\sqrt{\mu_o/\varepsilon_o}} \quad (b)$$

Thus, some known, modified, high impedance surfaces have a single-plane spiral inductor within the printed circuit board, connected to each via to increase inductance L. However, the inductance of a single-plane spiral is limited by typical dimensions of a printed circuit board construction, viz., the conductive traces are typically one mil thick and separated by gaps of about three mils. This relatively wide spacing of relatively narrow facing conductive surfaces limits the mutual inductance between adjacent coils. Since the inductance is limited, these high impedance surfaces are still relatively thick (several mm) because long vias are needed to provide some of the inductance.

To increase capacitance C, known high impedance surfaces have a second, deeper layer of conductive plates underneath a top first layer of conductive plates and between the vias attached to the first layer of plates. The plates on this second layer are either floating or connected to the ground plane by their own vias. The overlap between the two parallel layers of conductive plates creates an additional capacitance.

For such a configuration, a printed circuit board typically includes a dielectric layer of polyimide between the conductive plate layers and a layer of FR-4 as the substrate. Such a combination of polyimide and FR-4, however, is relatively expensive and problematic because polyimide and the metallization thereof are costly, and the combination of polyimide with FR-4 is also costly. Unfortunately, even these configurations cannot serve a frequency lower than about 1.6 GHz. Also, raising the capacitance C without raising the inductance L, as mentioned above, actually reduces the bandwidth as understood from equation (b).

Figure 3:
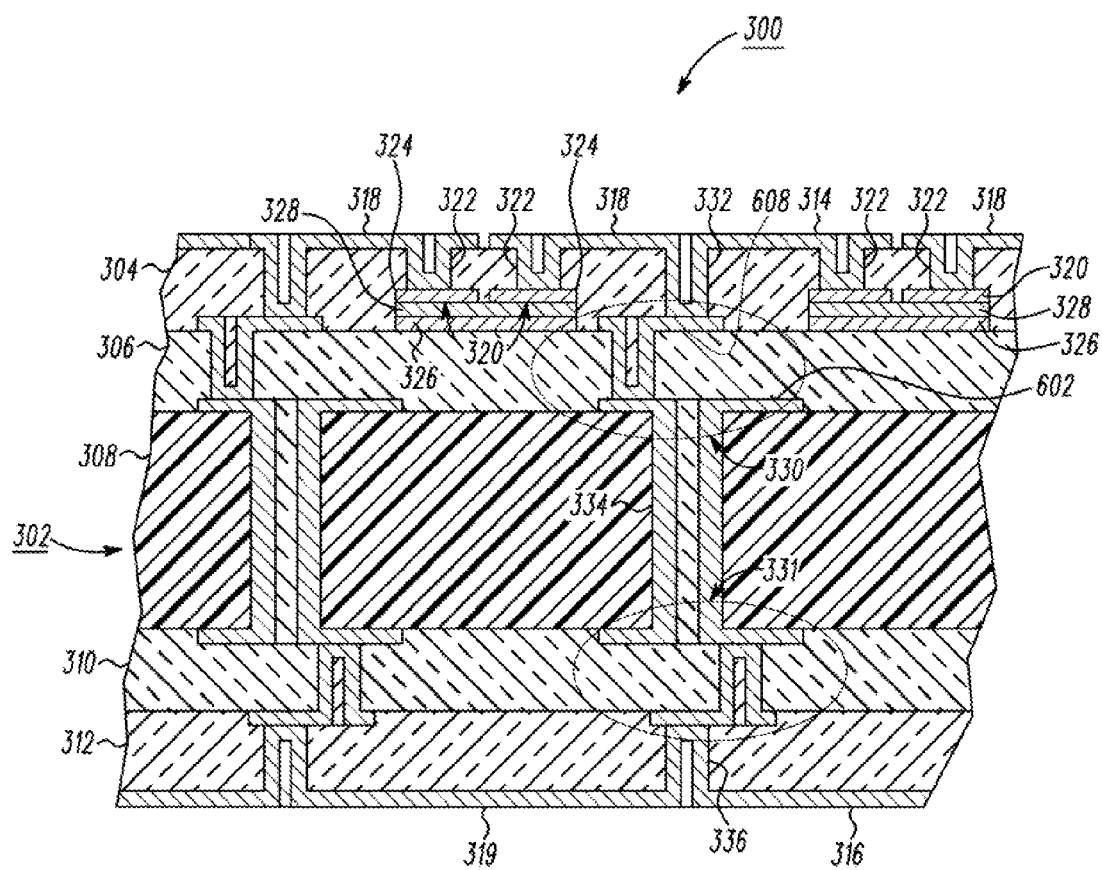
FIG. 3 comprises a simplified side, cross-sectional view of the high impedance surface configured in accordance with an embodiment of the present invention.

Referring now to FIGS. 3-7, by these teachings a high impedance surface 300 has a printed circuit board 302 that can be made of multiple layers. Here, each main layer of metal used to form the elements is counted as a layer. Thus, FIG. 3 shows a six-layer structure also known as 2/2/2 high-density interconnect board structure (by convention, the top electrode layer 324 of the mezzanine embedded capacitors 320 is not counted as a layer).

Each section of printed circuit board, here labeled 304-312, is separated by the metal layers and can be made of a different material. Thus, the central section 308 could be made of FR-4, or of TMM (Temperature-stabilized Microwave Materials), available from Rogers Corporation, or any other material suitable for printed circuit boards. The upper and lower sections 304-306 and 310-312 may be made of RCF (Resin-Coated-Foil), pre-preg (e.g., glass-reinforced epoxy), or any other material suitable for high-density interconnect board constructions.

Figure 5:
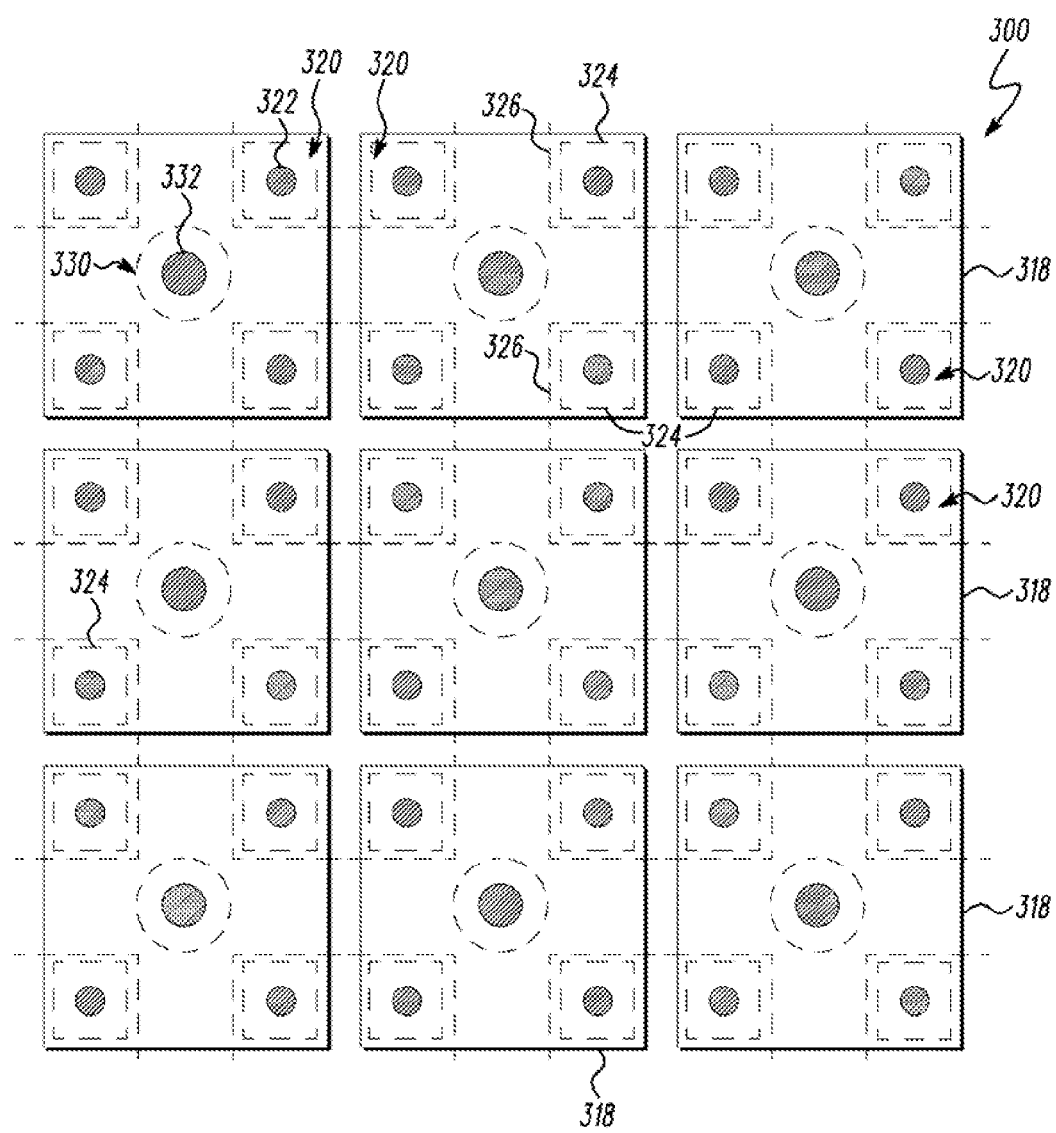
FIG. 5 comprises a plan view of the high impedance surface shown in FIG. 3.

The printed circuit board 302 has a first or top surface 314 and a second or bottom surface 316. The top surface 314 has a plurality of spaced, electrically conductive plates 318. As shown in FIG. 5, these plates 318 are square in one aspect of the invention. However, the plates 318 can be hexagonal or any other shape as long as the plates provide sufficient capacitance between them and maintain periodicity of some unit cell. In these illustrative embodiments, the plates 318 are all of equal size and form factor; if desired, however, and depending upon the specifics of a given application setting, at least some of the plates 318 may have differing sizes and/or form factors. The plates 318 are made of copper or other suitable conductive material. It will also be appreciated that the plates 318 need not always be on the very outer surface of the printed circuit board 302 as long as the plates can form resonant circuits that suppress surface waves on the top of the high impedance surface as described previously.

The second or bottom surface 316 has a continuous, electrically conductive plate 319 that acts as a ground plane or ground plate. By "continuous," all that is meant is that the conductive plate 319 provides a conductive path from one end of the plate to the other regardless of any holes, spaces, grooves, slots, or the like, within the plate. Thus, the ground plate 319 may be made of more than one piece as long as it performs as one continuous piece.

In another aspect of the invention, the high impedance surface 300 has a plurality of elements including at least one capacitor 320 and/or at least one inductor 330 or 331 embedded within the printed circuit board 302. The elements 320, 330, and 331 are electrically connected so that at least one pair of adjacent conductive plates 318, and, in one embodiment all adjacent conductive plates 318, are electrically coupled to each other by or through at least one of the plurality of elements 320 and/or 330/331. This structure forms a parallel resonant LC circuit with each pair of plates 318 that provides the advantages discussed above. For some embodiments, such as those that have very many very small features (such as vias) near a limit of reliable reproduction, with correspondingly small conductive plates, some of the benefits described herein may be achieved in a production high impedance surface having as few as 50% or more of the conductive plates disposed on the first surface of the printed circuit board are each electrically coupled to at least one adjacent conductive plate by at least one of the plurality of element. Thus, it may be said for these embodiments that substantially all of the conductive plates disposed on the first surface of the printed circuit board are each electrically coupled to at least one adjacent conductive plate by at least one of the plurality of element, wherein substantially means 50% or more.

Figure 4:
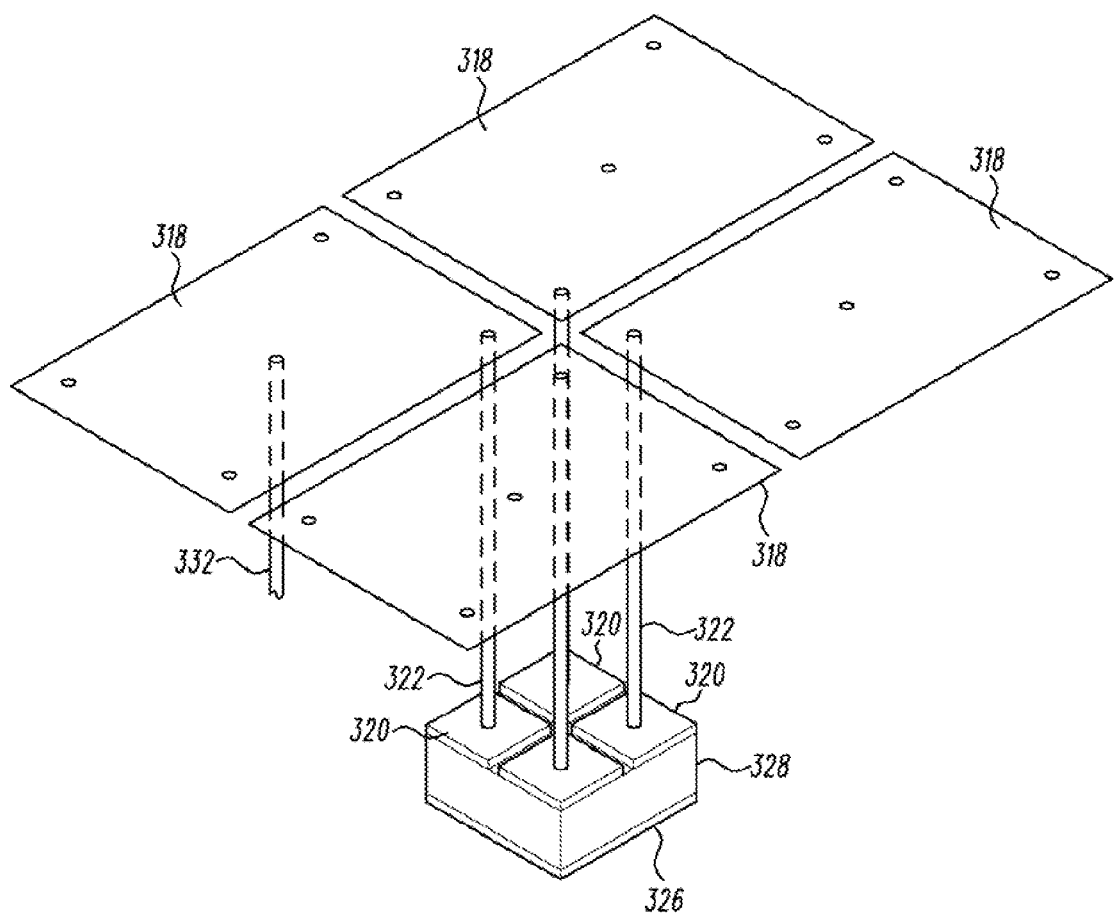
FIG. 4 comprises an exaggerated, close-up, top and side perspective view of a capacitor portion of the high impedance surface shown in FIG. 3.

In one form of the invention, each capacitor 320 is an embedded mezzanine capacitor. In this illustrative example, each square (or any other suitable shape) conductive plate 318 has one capacitor 320 connected to each of its corners by a conductive via 322. The conductive via 322 extends from a corner of the conductive plate 318 down to a top or first electrode 324 of each capacitor. A bottom or second electrode 326 extends under at least one or two of the first electrodes 324, but preferably underneath four of the first electrodes 324 located at the same intersection of plate 318 as shown in FIGS. 4-5. The electrodes 324 and 326 are made of copper foils but may be made of any other suitable thin, conductive material.

A dielectric 328 between the first and second electrodes 324, 326 may comprise a positive-acting, liquid, photo-sensitive epoxy resin loaded with BTO (Barium Titanate) (sometimes called a ceramic-filled polymer (CFP)). This material is applied to the high impedance surface mezzanine electrodes 326 with a method such as roller coating as disclosed by U.S. Pat. No. 6,349,456 assigned to the assignee of this application (the contents of which are incorporated herein by this reference).

The final cured thickness of the dielectric 328 can be as little as 5 microns while still maintaining very low defect density and thus high yield. The relative dielectric constant is at least over approximately 6 and may be between approximately 10-50 or even approximately 25-30. This results in achievable capacitance density about 50 times greater than the 4-mil polymide as characterizes the prior art. By one approach, the CFP is applied as a liquid and cured on the electrodes 326 so that it is not handled as a stand-alone sheet material.

It will be appreciated that while capacitor 320 is described as having one first electrode 324, the mezzanine capacitor also refers to the complete electrical path down through one first electrode 324 from one plate 318, through the dielectric and the second electrode 326 and back up through another first electrode 324 to another plate 318, which constitutes two capacitors in series. It will be understood, however, that the mezzanine capacitor could include a single first electrode and a plurality of bottom electrodes 326 directly connected by vias to the conductor plates 318.

As shown in FIG. 3, the high impedance surface 300 may also have two vertically-spaced, distinct inductors 330, 331. A conductive via 332 extends from at least one conductive plate 318 to a first multi-layer inductor 330. A conductive via 334 extends from the first inductor 330 downward to a second, lower inductor 331. Finally, a conductive via 336 extends from the lower inductor 331 to the ground plate 319. In one form, the conductive via 332 extends from each conductive plate 318 to provide two vertically spaced inductors 330, 331 thereunder. This structure increases the inductance in each parallel resonant LC circuit.

Figure 6:
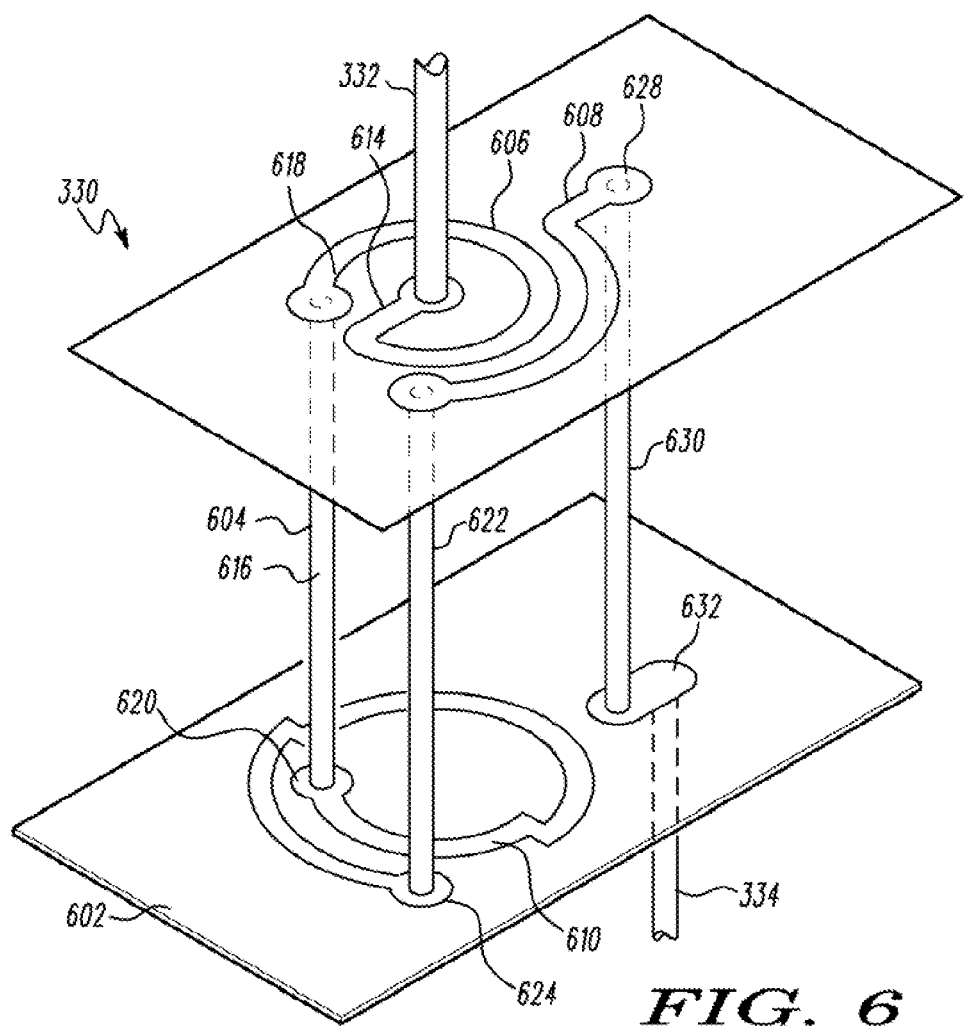
FIG. 6 comprises an exaggerated, side, close-up perspective view of an inductor portion of the high impedance surface shown in FIG. 3.

Referring to FIG. 6, each inductor 330 or 331 is a multi-layer or multi-level inductor that takes advantage of typical printed circuit board dimensions to maximize the mutual inductance between coils. The vertical space between turns of the coils of the inductor 330 or 331 is typically 2 mils, compared to the typical 3-mil horizontal space between coils in the same plane. More importantly, the facing areas of the coils can be extended to 6-mil wide to increase mutual inductance. Each inductor 330 or 331 provides 2½-turns. Since two multi-layer inductors 330 and 331 are stacked for each conductive plate 318, each resonant circuit with two adjacent conductive plates 318 comprises ten-turn inductors for the high impedance surface 300.

Figure 7:
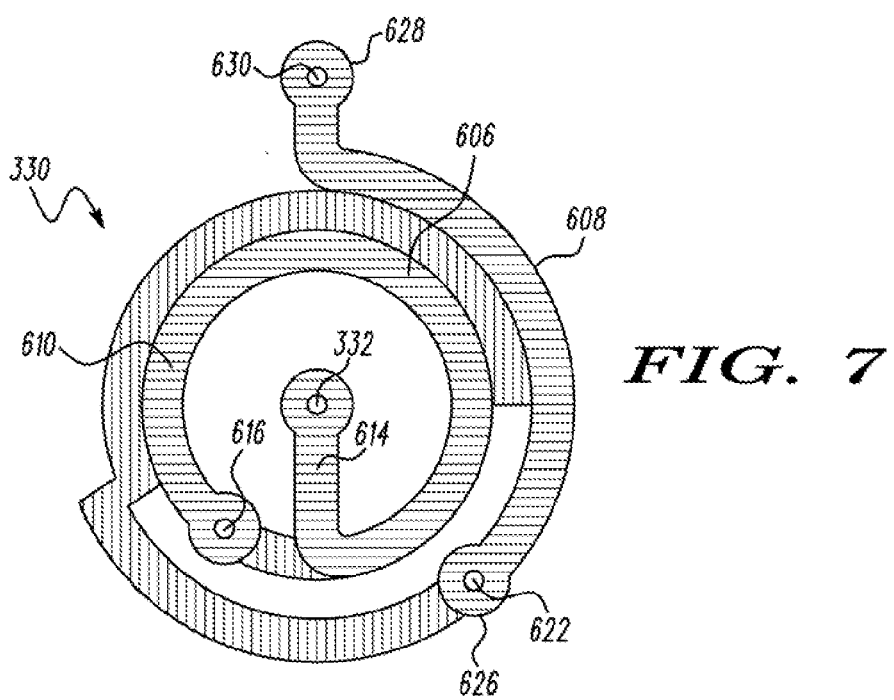
FIG. 7 is a simplified plan view of the inductor of FIG. 6.

As to the specific structure, FIGS. 6-7 show an upper inductor 330 while the lower inductor 331 is similar except inverted. Generally, each multi-layer inductor 330 is constructed so that its coils extend on at least two vertically-spaced planes including a first plane 600 and a second plane 602. A number M of separate coil portions may extend in the first plane while N separate coil portions extend in the second plane so that at least (M+N−1) vertical couplers electrically couple the vertically spaced coil portions in the first and second planes to each other to form a continuous inductor coil 604.

In one example, the inductor 330 includes a first inner coil portion 606 separate from a generally concentric, second, outer coil portion 608 in the first plane 600. A third coil portion 610 is located in the second plane 602 and positioned horizontally between the first and second coils 606, 608 as shown in FIG. 7. This particular configuration minimizes sensitivity to layer misregistration, improving manufactured inductor tolerances. It will be appreciated that many other configurations are contemplated, such as placing the lower coil(s) entirely and directly below the upper coil(s), but at the minimum, so that the vertically spaced coils are mutually inductive. More than two layers may be provided and each layer may have more or fewer coil portions than shown here (e.g., at least one coil portion per layer).

To couple the inductors 330 and 331 to the conductive plates 318 and to form the parallel LC circuits, the conductive via 332 extends from a conductive plate 318 and terminates at an end 614 of the first coil portion 606 centrally located on inductor 330. To connect the inductor layers 600, 602 to each other, a first coupler or conductive micro via 616 extends from another end 618 first coil portion 606 and downward to the second plane 602 and end 620 of the lower coil portion 610. A second micro via 622 extends back upward from an end 624 of the lower coil portion 610 to an end 626 of the second upper coil portion 608. An end 628 of the second coil portion 608 may be connected to the main conductive via 334 that extends downward to the lower inductor 331. In this particular example, however, another conductive micro via 630 is provided at the end 628 to extend from the upper second coil portion 608 and downward to the second plane 602 where it connects to a conductive step or jog 332 which in turn connects to main conductive via 334. The jog 632 is simply provided so that the main via 334 can be placed below the center of each conductive plate 318 for ease of manufacture. It will be appreciated that although coil portions 606, 608 and 610 are shown to be curvilinear, many other shapes and constructions are possible as long as they provide vertically spaced, adjacent traces or coil portions with current flow in the same direction in order to create the inductance.

It will also be appreciated that the high impedance surface 300 may have only one multi-layer inductor 330 or 331 instead of two multi-layer inductors vertically spaced from each other. In addition, while each upper inductor 330 is shown to have multiple coil portions on an upper plane 600 and each lower inductor 331 to have multiple coil portions on its lower plane 602, this configuration can be inverted, have all coil portions uniformly configured instead, or have any other configuration that increases inductance or manufacturing efficiency.

Figure 8:
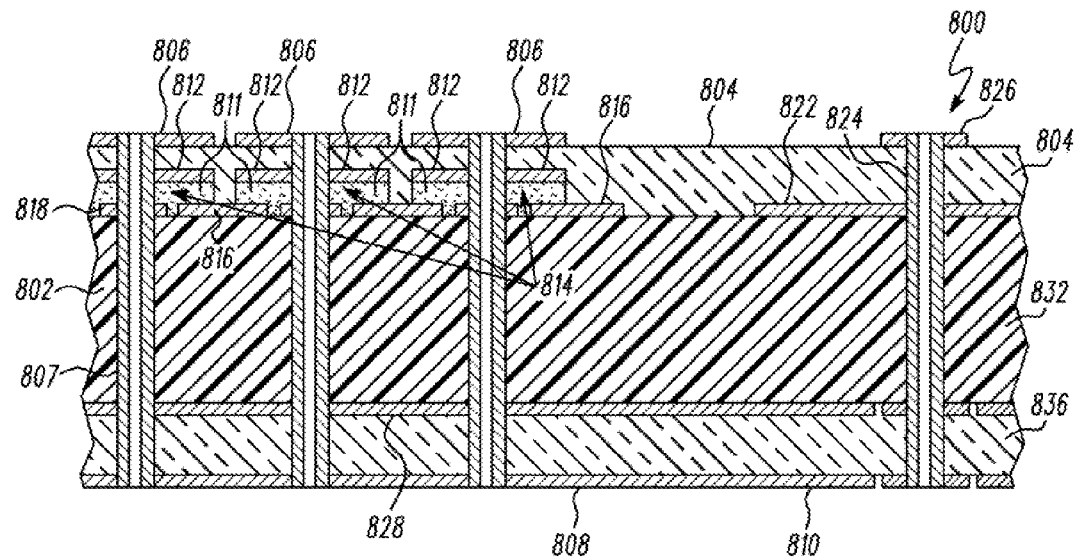
FIG. 8 comprises a side, cross-sectional view of an alternative embodiment of the high impedance surface in accordance with the present invention.
Figure 9:
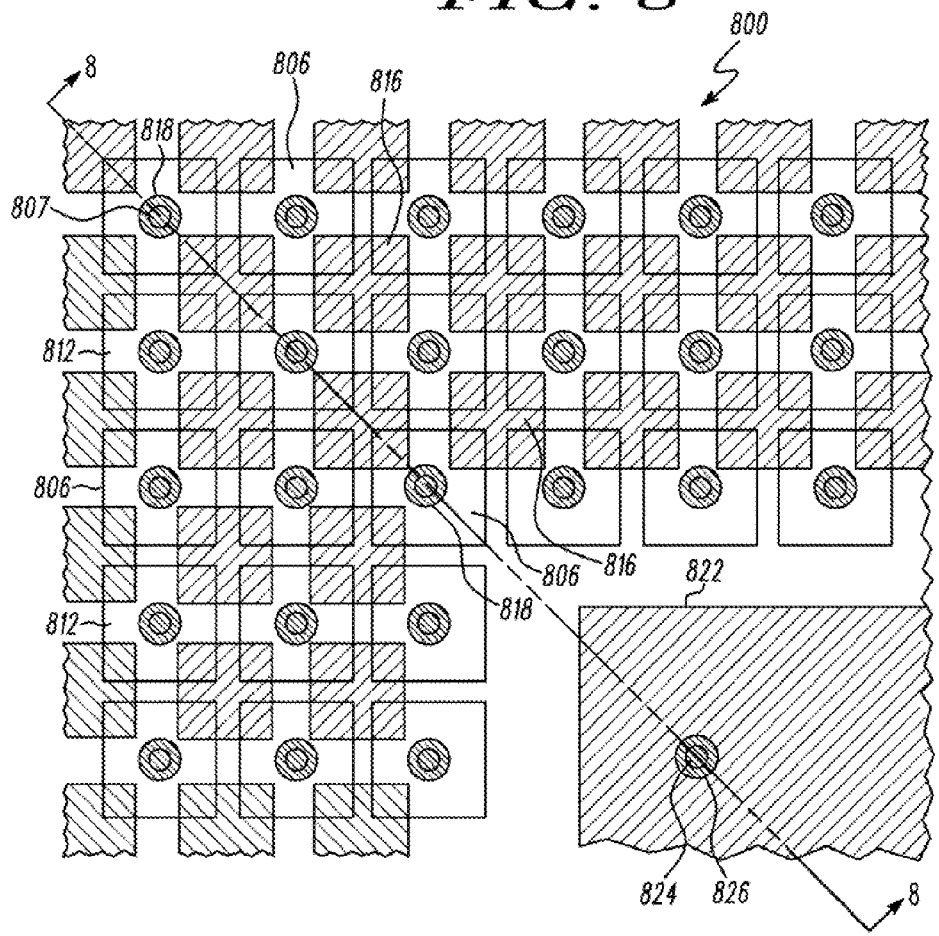
FIG. 9 comprises a plan view of the high impedance surface of FIG. 8.

Referring now to FIGS. 8-9, in an alternative aspect of the invention, a high impedance surface 800 has a printed circuit board 802 made of a thick central section 832 of TMM-10 (although it could be other TMM variants or any suitable low-loss material) and thinner upper and lower sections 834, 836 of glass-reinforced epoxy (pre-preg or any other similar material). The high impedance surface 800 also has an upper surface 804 with a plurality of conductive plates 806 and a lower surface 808 with a continuous ground plate 810. This example also has an embedded mezzanine capacitor 811 with upper first electrodes 812 spaced from lower second electrodes 816, and a CFP dielectric 814 with a relative dielectric constant of at least approximately 6 or greater and preferably 25-30 or 10-50. A conductive via 807 connects each conductive plate 806 and capacitor 811 to the ground plane 810. In this example, the lower electrodes 816 of these capacitors 811 are floating but could be directly connected to a conductive via leading to ground 810.

As shown in plan view in FIG. 9, the upper first electrodes 812 of the capacitors 811 are substantially the same size as the conductive plates 806 although the sizes may be different as the capacitive or manufacturing efficiency needs require. The lower electrodes 816 are disposed at the corners of the upper electrode 812 and conductive plates 806 for forming an alternating pattern so that capacitance is created by the overlap of the first and second electrodes 812, 816. The capacitors 811 also optionally have capture pads 818 to help anchor the plated vias 807. In one example, the high impedance surface 800 also has a redundant ground-plane 828 in order to provide mechanical symmetry in the printed circuit board construction and thus prevent warping and provide stability.

Also a part of this alternative aspect of the high impedance surface, the high impedance surface 800 has a patch antenna 822, which is a flat plate of copper or other metal that is embedded underneath or on the top surface 804 of the printed circuit board 802. The antenna 822 is usually square but can be many other shapes. The patch antenna 822 is generally surrounded by the embedded elements and conductive plates 806 on the high impedance surface, and generally extends in the same plane as the bottom electrodes 816. It could, however, be placed on any layer where the resultant antenna can transmit and/or receive signals. The antenna is contacted through a via 824 that passes through the ground plane 808 and out of the back of the high impedance surface 800. Such a patch antenna 822 is typically used for both satellite and terrestrial communications, such as on base station towers and other similar applications. This configuration suppresses surface waves for the patch antenna 822 so that radiated energy is more directional. (Those skilled in the art will understand that patch antenna as used herein refers to any generally flat antenna that sends and/or receives signals.)

Figure 10:
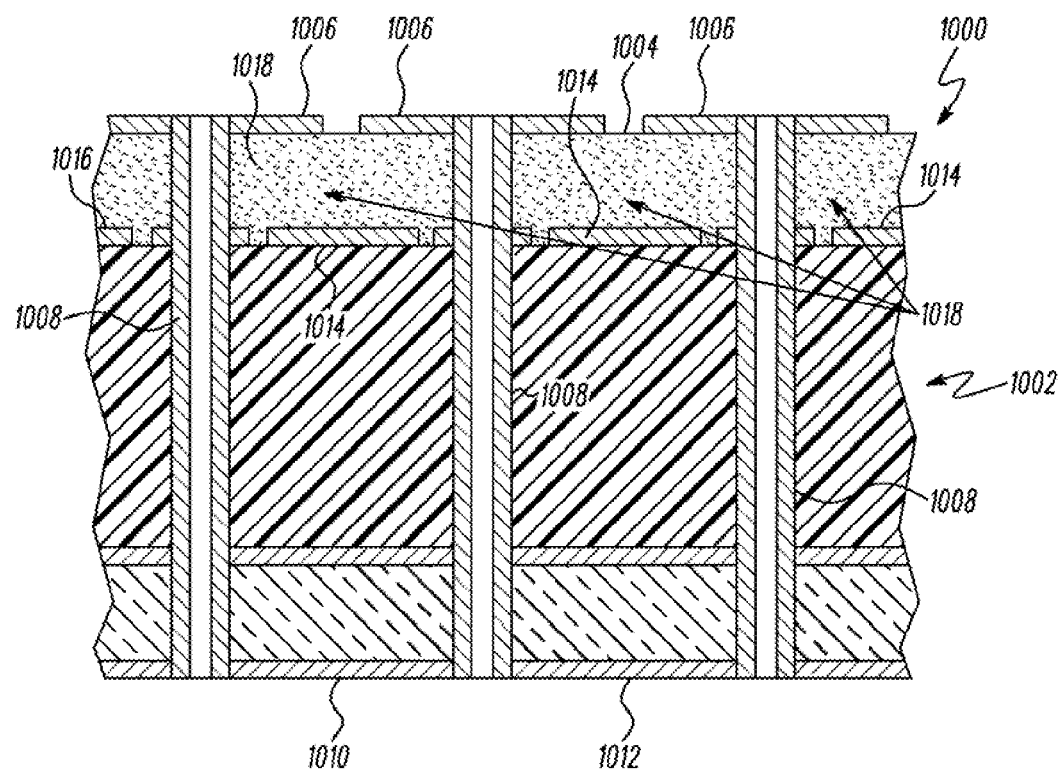
FIG. 10 comprises a side, cross-sectional view of another alternative embodiment of the high impedance surface in accordance with the present invention.

Referring now to FIG. 10 another alternative aspect of a high impedance surface 1000 includes a printed circuit board 1002 with conductive plates 1006 on a first surface 1004 and a ground plate 1012 on a lower or second surface 1010. Conductive vias 1008 connect the conductive plates 1006 to the ground plate 1012.

The high impedance surface 1000 does not have true mezzanine capacitors in this embodiment. Instead, one layer of conductive plates 1014 are placed below at least two, and in the example shown, four, corners of the conductive plates 1006 on the upper surface 1004 of the high impedance surface 1000. A CFP dielectric 1018 has a constant greater than six and is placed between the conductive plates 1006 and the lower electrodes 1014. This creates a capacitive path from one conductive plate 1006, down to a lower electrode 1014, and back up to an adjacent conductive plate 1006. The lower electrodes 1014 are shown to be floating but may be connected to the ground plate 1012 by conductive vias.

Figure 11:
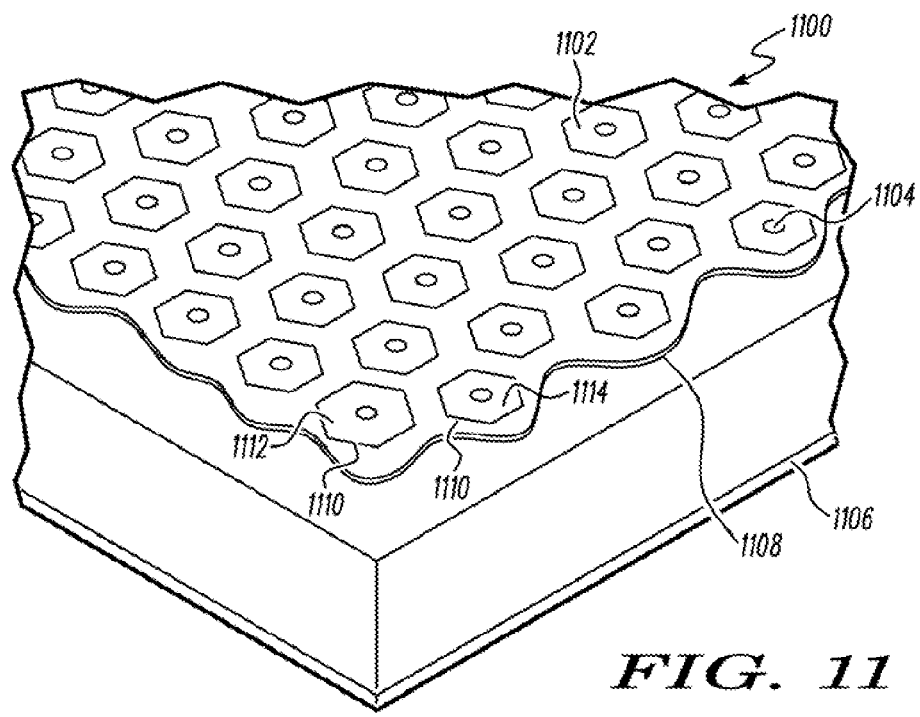
FIG. 11 comprises a top perspective view of yet another alternative embodiment of the high impedance surface in accordance with the present invention.

Referring now to FIG. 11, in another example, the CFP dielectric is used to enhance the fringing capacitance between conductive plates. In this alternative configuration, the high impedance surface 1100 has a plurality of hexagonal conductive plates 1102 connected by vias 1104 to a ground plane 1106. Each conductive plate 1102 has the CFP dielectric 1108 coated around its rims 1110 and extending to the adjacent plates. The presence of the high dielectric constant CFP 1108 dielectric increases the fringing capacitance between each pair of adjacent conductive plates 1112, 1114. The dielectric 1108 has a constant of at least six but in one example approximately 10-50 or even 25-30.

Figure 12:
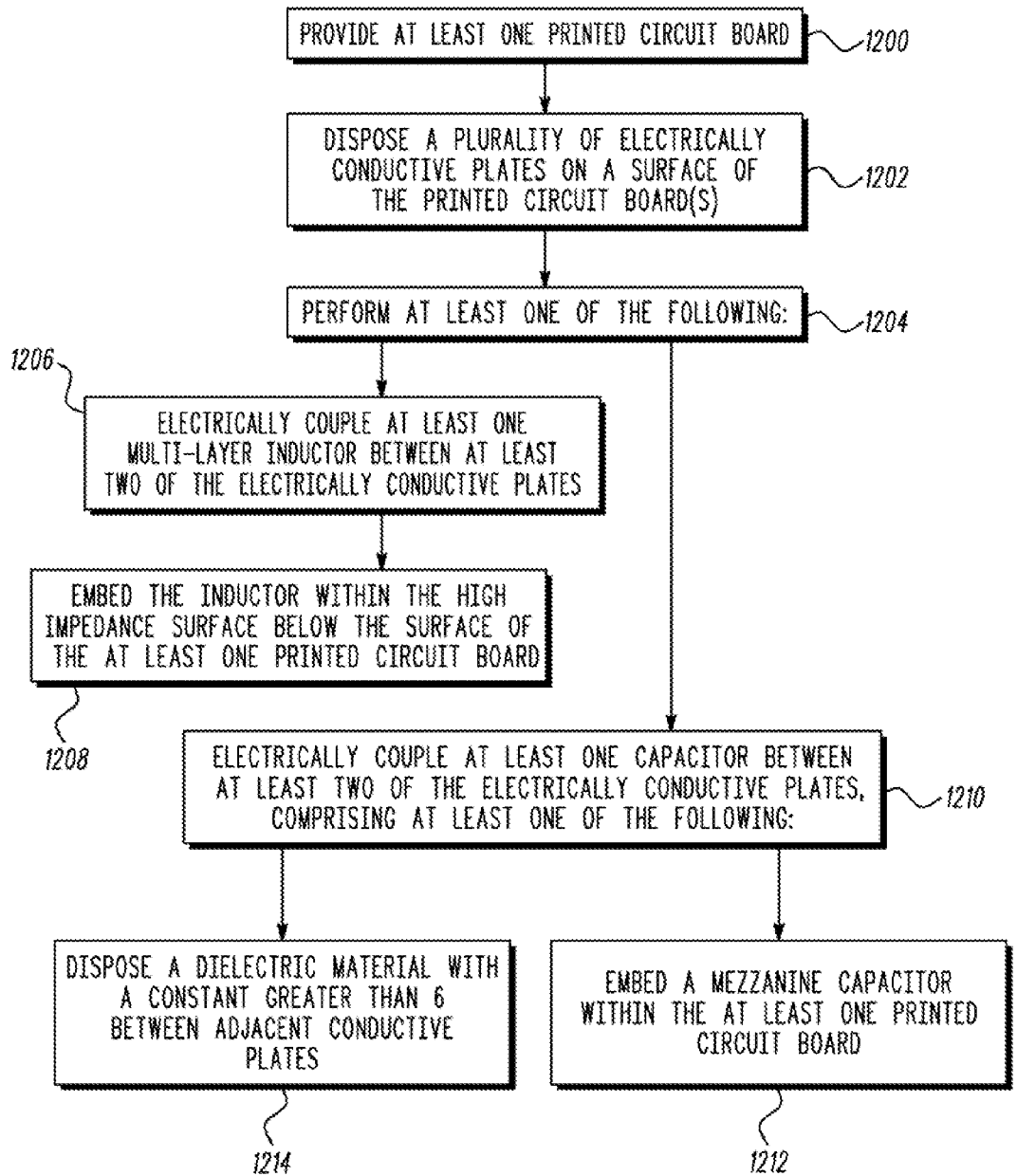
FIG. 12 is a flow chart showing a method of producing a high impedance surface in accordance with the present invention.

Referring now to FIG. 12, the basic steps for producing the high impedance surface 300, 800 or 1000 are shown in steps 1200-1214 for providing the features as previously described above with respect to FIGS. 3-11. Generally, in order to produce the high impedance surface, at least one printed circuit board is provided (step 1200) and has a plurality of electrically conductive plates placed on a surface of the printed circuit board (step 1202). The high impedance surface can be produced by providing at least one embedded element, such as inductors, capacitors or both (step 1204). This includes electrically coupling at least one multi-layer inductor between at least two of the electrically conductive plates (step 1206). The inductor is embedded within the high impedance surface below the surface of the at least one printed circuit board (step 1208).

In the alternative, at least one capacitor is electrically coupled between at least two of the electrically conductive plates (step 1210). This includes either embedding a mezzanine capacitor within the at least one printed circuit board (step 1212), or disposing a dielectric material with a relative dielectric constant greater than six between adjacent conductive plates (step 1214).

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

What is claimed is:

1. A high impedance surface comprising:
   a printed circuit board having a first surface and a second surface;
   a continuous electrically conductive plate disposed on the second surface of the printed circuit board;
   a plurality of electrically conductive plates disposed on the first surface of the printed circuit board;
   a plurality of elements, each element comprising at least one of: at least one multi-layer inductor electrically coupled between at least two of the electrically conductive plates and embedded within the printed circuit board; at least one capacitor electrically coupled between at least two of the electrically conductive plates, wherein the at least one capacitor comprises at least one of: a dielectric material disposed between adjacent electrically conductive plates, wherein the dielectric material has a relative dielectric constant greater than 6:
   a mezzanine capacitor embedded within the printed circuit board, wherein the mezzanine capacitor comprises:
      at least two first electrodes disposed below the first surface of the printed circuit board, each first electrode being electrically coupled to a different one of the conductive plates disposed on the first surface of the printed circuit board,
      a second electrode capacitively coupled to the at least two first electrodes, and
      a dielectric disposed between the second electrode and the at least two first electrodes.

2. The high impedance surface of claim 1, wherein substantially all of the conductive plates disposed on the first surface of the printed circuit board are each electrically coupled to at least one adjacent conductive plate by at least one of the plurality of elements.

3. The high impedance surface of claim 1, wherein the dielectric material comprises a ceramic filled polymer.

4. The high impedance surface of claim 3, wherein the ceramic filled polymer has a relative dielectric constant of 10-50.

5. The high impedance surface of claim 1, further comprising a patch antenna disposed on the printed circuit board.

6. The high impedance surface of claim 1, further comprising an antenna generally surrounded by the plurality of plates on the first surface of the circuit board.

7. The high impedance surface of claim 1, wherein the dielectric material is disposed along the periphery of at least one of the plates.

* * * * *